(12) United States Patent
Shen

(10) Patent No.: US 7,436,683 B2
(45) Date of Patent: Oct. 14, 2008

(54) WAFER LEVEL PACKAGING STRUCTURE WITH INDUCTORS AND MANUFACTURE METHOD THEREOF

(75) Inventor: Lee-Cheng Shen, Hsinchu (TW)

(73) Assignee: Industrial Technology Research Institute, Chu-Tung, Hsinchu (TW)

( * ) Notice: Subject to any disclaimer, the term of this patent is extended or adjusted under 35 U.S.C. 154(b) by 0 days.

(21) Appl. No.: 11/639,557

(22) Filed: Dec. 15, 2006

(65) Prior Publication Data

US 2007/0217174 A1 Sep. 20, 2007

(30) Foreign Application Priority Data

Mar. 17, 2006 (TW) .............................. 95109355 A

(51) Int. Cl.
*H05K 1/11* (2006.01)
(52) U.S. Cl. .................. 361/801; 361/759; 361/802; 361/756
(58) Field of Classification Search .............. 361/803, 361/801, 802, 759, 756, 752–753
See application file for complete search history.

(56) References Cited

U.S. PATENT DOCUMENTS

| 5,611,884 | A | * | 3/1997 | Bearinger et al. ........... 156/325 |
| 5,674,787 | A | * | 10/1997 | Zhao et al. ................. 438/627 |
| 5,844,299 | A | | 12/1998 | Merrill et al. |
| 6,008,102 | A | | 12/1999 | Alford et al. |
| 6,180,445 | B1 | | 1/2001 | Tsai |
| 6,495,903 | B2 | | 12/2002 | Xu et al. |
| 6,512,285 | B1 | | 1/2003 | Hashemi et al. |
| 6,784,020 | B2 | | 8/2004 | Lee et al. |
| 6,835,631 | B1 | | 12/2004 | Zhen et al. |
| 6,972,081 | B2 | | 12/2005 | Wong |
| 6,990,729 | B2 | | 1/2006 | Pleskach et al. |
| 2003/0006474 | A1 | | 1/2003 | Gardner |
| 2003/0112114 | A1 | | 6/2003 | Long et al. |
| 2004/0087043 | A1 | * | 5/2004 | Lee et al. ........................ 438/6 |

FOREIGN PATENT DOCUMENTS

| CN | 1478294 | 2/2004 |
| JP | 2005347723 | 12/2005 |
| TW | 558921 | 10/2003 |
| TW | 560018 B | 11/2003 |
| TW | 586225 | 5/2004 |

* cited by examiner

*Primary Examiner*—Tuan T. Dinh
*Assistant Examiner*—Abiy Getachew
(74) *Attorney, Agent, or Firm*—Morris Manning Martin LLP; Tim Tingkang Xia, Esq.

(57) ABSTRACT

A wafer level packaging structure with inductors and manufacture method thereof. The method comprises providing a substrate, having several inductors, forming conductive lines and holes to connect the inductors and the wafer, and bonding the substrate and the wafer via bonding pads. Therefore, there are air gaps between the inductors and the wafer, thereby reducing the inductor's dispassion loss and increasing the inductor's quality factor. In addition, the inductors having a high quality factor can be integrated in the wafer containing active/passive components.

14 Claims, 9 Drawing Sheets

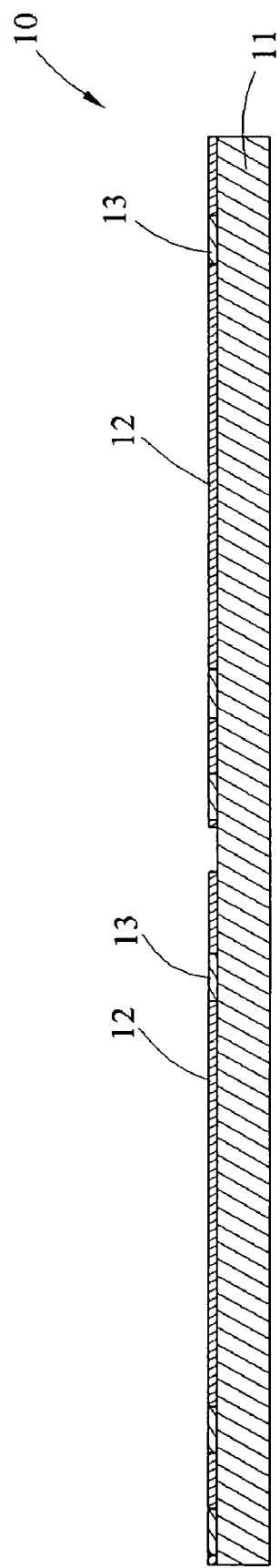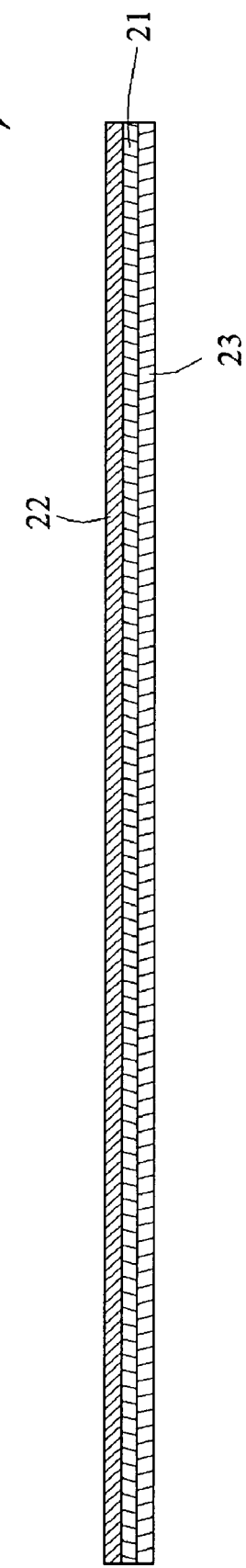

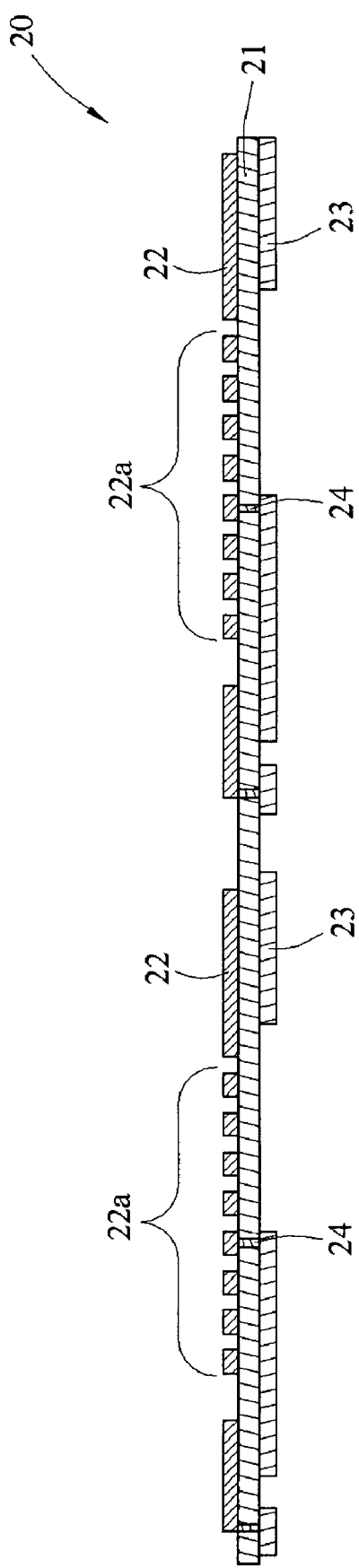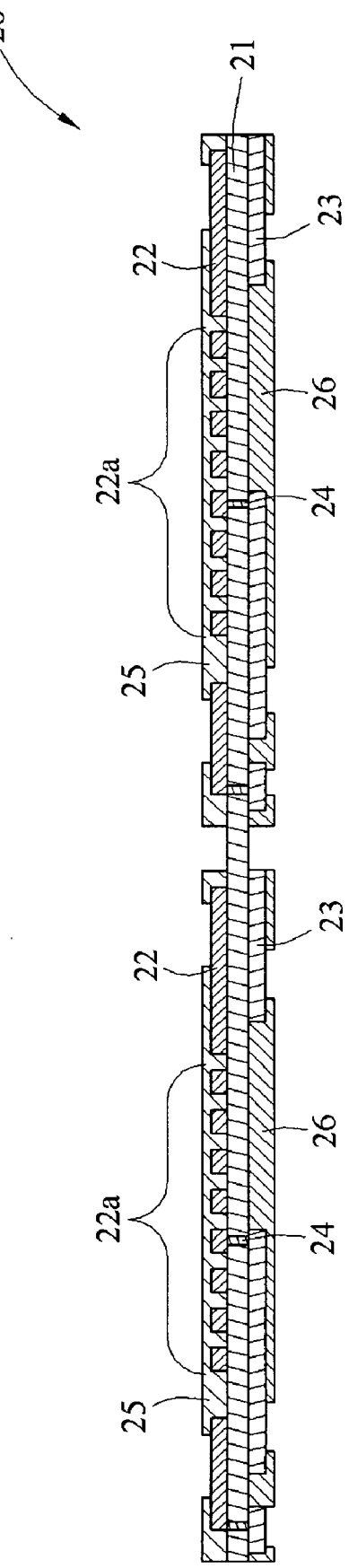

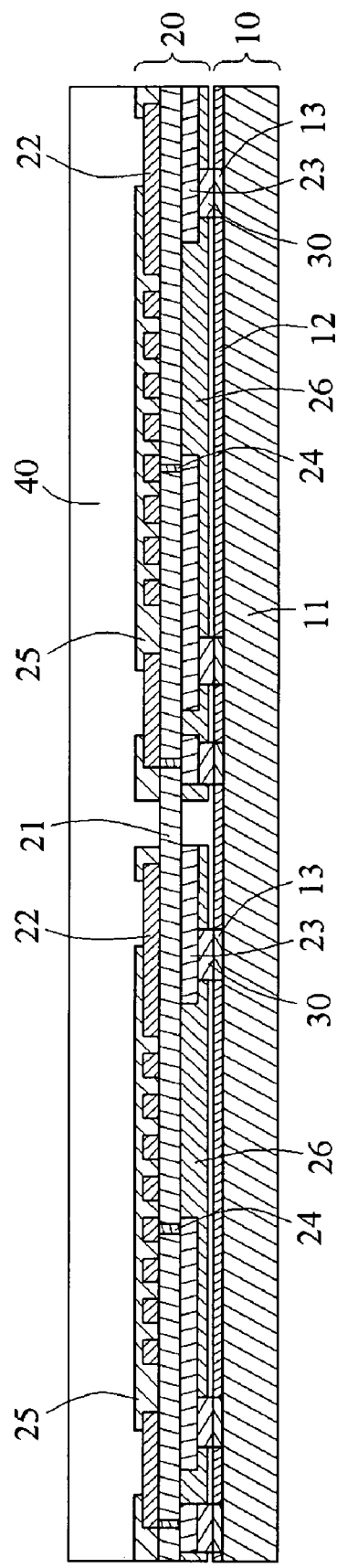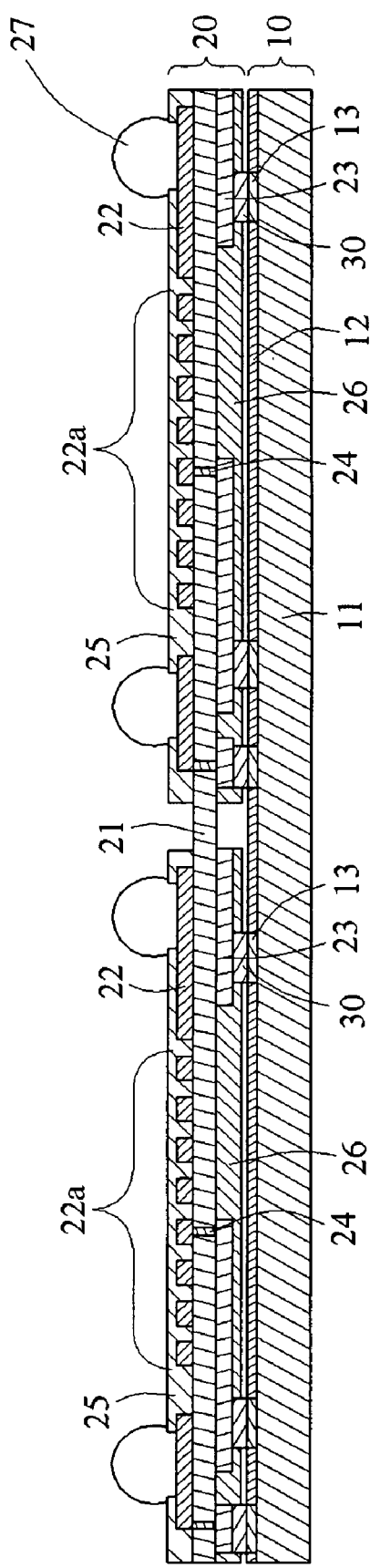

WAFER LEVEL PACKAGING STRUCTURE WITH INDUCTORS AND MANUFACTURE METHOD THEREOF

CROSS-REFERENCE TO RELATED APPLICATIONS

This non-provisional application claims priority under 35 U.S.C. § 119(a) on Patent Application No(s). 095109355 filed in Taiwan, R.O.C. on Mar. 17, 2006, the entire contents of which are hereby incorporated by reference.

BACKGROUND OF THE INVENTION

1. Field of Invention

The invention relates to a packaging structure and a manufacture method and more particularly to a wafer level packaging structure with inductors and manufacture method thereof.

2. Related Art

An inductor is a kind of passive device, which is also known as coil. The inductor is a component, which is coiled with a conducting wire to have an inductance property. By changing the current going through the coil, the coil will have a different magnetic flux. Usually, an inductor having a single coiled conducting wire will have self-inductance and an inductor coiled with more than one conducting wire will have mutual-inductance. The main purpose of an inductor is to prevent the interference of an electromagnetic wave, to shield the electromagnetic wave radiation or to filter the noise of the current. An inductor is widely applied in power supply, monitors, converters, motherboards, scanners, telephones or modems.

Besides, an inductor is often integrated in a semiconductor substrate in order to reduce the production cost of small and high integrity components for a wireless communication product. Radio frequency (RF) inductance is widely used in an RF module for wireless communication. When the frequency of a carrier wave is getting higher and higher, the demand for an inductance with a high quality factor is also increasing.

Insufficient quality is the biggest problem of integrating an inductor in a semiconductor substrate. The efficiency of the inductor in the semiconductor can not be as good as an ideal inductor because a coil has impendence loss during the metallization process, and because of the impendence of the semiconductor substrate and the capacitance, which is coupled to the substrate. Usually, a quality factor is used for estimating the efficiency of an inductor. In order to reduce the loss, have the highest quality factor, and comply with the semiconductor process at the same time, the inductor coil must be made of a metal, which has low impendence loss. In addition, in order to reduce the loss caused by the eddy current of the semiconductor substrate and reduce the capacitance, which is coupled to the substrate, the inductor coil should stay away from the substrate as far as possible.

Thus, in order to improve the inductor quality factor, U.S. Pat. No. 5,844,299 disclosed an integrated inductor, which was formed by etching a cave on the substrate, depositing a dielectric material group in the cave, forming a dielectric layer on the dielectric material group and forming a conducting coil on the dielectric layer, such that the parasitic effects and the energy loss of the substrate can be reduced by intervening the dielectric material group and the dielectric layer between the coil and the substrate. In addition, U.S. Pat. No. 6,008,102 disclosed an integrated inductor, which had a coil with three-dimensional structures. The three dimensional structure was formed by multiple photography, etching and metal material depositing processes. The inductor coupling effects between the three dimensional coils can restrain the magnetic field so that low reactance can be retained and a self shielding effect can be created to improve the inductor quality factor.

Moreover, the energy loss caused by the substrate can be reduced by using an etching process to excavate some parts of the substrate and support an inductor by some holders. For example, U.S. Pat. No. 6,495,903 disclosed an integrated circuit inductor including a spiral aluminum coil, which was deposited on an oxidation layer of a silicon substrate. The silicon substrate had been excavated to form an air hole, which is below the coil to provide a low dielectric constant medium, such that the impedance of the substrate and the capacitance, coupled to the substrate, can be reduced. However, the process of forming an air hole below the metal coil after depositing the metal coil, in order to use the oxidation layer to support the metal coil, needs complex and more etching processes. U.S. Pat. No. 6,835,631 disclosed an inductor manufacturing process, which can improve the inductor quality factor. The process included forming a first oxidation layer on a substrate, forming a low dielectric constant layer on the first oxidation layer and forming a second oxidation layer on the low dielectric constant layer. Next, an air gap was formed by etching the second oxidation layer and the low dielectric constant layer. An upper low dielectric constant layer was then formed. Finally, an inductor was formed in the upper low dielectric constant layer, which was above the air gap. The process also needed etching processes in order to form air gaps for improving the inductor quality factor.

In summary, the quality of an integrated inductor in the semiconductor substrate is not good because of the impendence of the substrate and the capacitance coupled to the substrate. Therefore, in order to isolate the inductor coil from the substrate to reduce the inference, an air medium is necessary between the coil and the substrate. However, the present processes to provide the air gap or air hole are all involved etching processes, which are more complex, such, that the yield is hard to improve.

SUMMARY

According to the foregoing problems, the invention provides a wafer level packaging structure with inductors and manufacture method thereof. First, an inductor, a conducting wire layout and via holes are formed on a low loss substrate. Via holes are formed for connecting the inductor and the wafer substrate. A substrate, which has an inductor, and a wafer substrate, then can be aligned and bond by pads, which produces an air medium between the inductor and the wafer substrate, such that inductance loss can be reduced and the inductor quality factor can be improved. Therefore, using the invention, an inductor on a low loss substrate with high quality factor can be integrated on a wafer, which achieves high performance active and/or passive component integration in wafer level. An embodiment of a manufacturing method of a wafer level packaging structure with inductors includes the following steps. First, a first substrate is provided. A second substrate is then formed with at least one inductor. The first substrate is connected to the second substrate by the pads, which produces gaps between the first substrate and the second substrate. The pads are used to electrically connect the inductors to the first substrate. The first and second substrates can be further cut to form wafer level packages, which have inductors. Among them, the first substrate can be a silicon substrate, which has an active component and/or a passive component.

The process of forming the second substrate can include the following steps. First, a dielectric layer is provided. The first surface of the dielectric layer includes a first metal layer and the second surface of the dielectric layer includes a second metal layer. The first metal and the second metal layers are then etched to form coils and metal wires for the inductors. Via holes are formed in the dielectric layers and metal conductors are formed in the via holes to connect the first metal layers to the second metal layers. Next, a first insulation layer and a second insulation layer are formed, where the first insulation layer covers the first metal layer and the second insulation layer covers the second metal layer. The first insulation layer and the second insulation layer are then etched to expose the joints of the metal wires.

An embodiment of a wafer level packaging structure with inductors includes a first substrate, pads on the first substrate and a second substrate on the pads. The second substrate includes inductors. The pads are used to electrically connect the inductors to the first substrate. There are gaps between the first substrate and the second substrate. The first substrate further includes active components and/or passive components.

The second substrate includes a dielectric layer, a first metal layer which is located on the first surface of the dielectric layer and includes a inductor, a second metal layer which is located on a second surface of the dielectric layer, metal conductors which are located in the via holes of the dielectric layers for connecting the first metal layer to the second metal layer, a first insulation layer which is located on the first metal layer, and a second insulation layer which is located on the second metal layer. The second substrate can further include solder bumps, which are located on the first metal layer. After cutting the first substrate and the second substrate, wafer level packages, which include inductors, can be formed.

Since the inductors are formed on the second substrate in the process, an inductance of a three dimensional solenoid type inductor can be increased by increasing the thickness of the dielectric layer. The package includes the integration of the inductors in the first substrate, which has active components and/or passive components but an etching process for forming an air gap is not necessary because the air gap can be formed when connecting the first substrate and the second substrate, using the pads. As a result, the impedance of the first substrate and the capacitance coupled to the first substrate can be reduced by the air gap and the inductor quality factor can be increased. This method doesn't have a complicated etching process, therefore, the device will not be damaged and the yield can be improved.

Further scope of the applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and constitute a part of this specification, illustrate embodiments of the invention and together with the description serve to explain the principles of the invention. In the drawings:

FIGS. 2A to 2I are perspective views of the first exemplary embodiment;
and
FIG. 3A to 1B are perspective view of a second exemplary embodiment.

DETAILED DESCRIPTION

Reference will now be made in detail to the embodiments of the invention, examples of which are illustrated in the accompanying drawings.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1A:
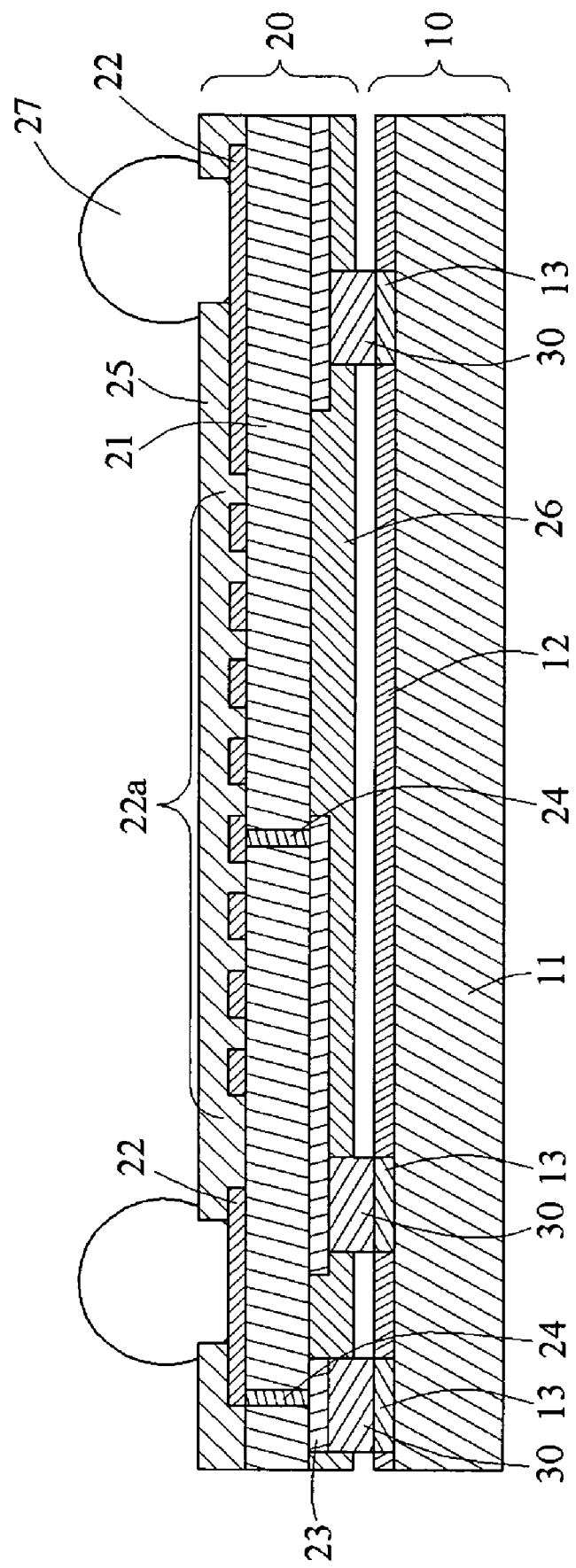
FIGS. 1A to 1B are perspective views of a first exemplary embodiment.

FIG. 1A is a first embodiment of a wafer level packaging structure with inductors. The structure includes a first substrate 10, pads 30 on the first substrate 10, and a second substrate 20 on the pads 30. The second substrate 20 has an inductor 22a; the pads 30 are used for electrically connecting the inductor 22a to the first substrate 10. There are gaps between the first substrate 10 and the second substrate 20. The surface between the first substrate 10 and the pads 30 can further include active components and/or passive components (not shown).

The second substrate 20 includes a dielectric layer 21; a first metal layer 22 on a first surface of the dielectric layer 21 (as shown in FIG. 1), which includes the inductor 22a; a second metal layer 23 on a second surface of the dielectric layer 21 (as shown in FIG. 1); metal conductors 24 which are located in the via holes of the dielectric layer 21 for connecting the first metal layer 22 and the second metal layer 23; a first insulation layer 25 which is located on the first metal layer 22, and a second insulation layer 26 which is located on the second metal layer 23. The second substrate 20 can further include solder bumps 27, which are located on the first metal layer 22.

The first substrate 10 includes a silicon substrate 11, insulating areas 12 and conductive areas 13. The conductive area 13 electrically connects the active components and/or passive components (not shown). Since there are pads 30 interposing between the conductive areas 13 and the second metal layer 23, the first metal layer 22 (including the inductor 22a), the metal conductor 24, the second metal layer 23, the pad 30 and the conductive area 13 can become a whole conductive path. The low dielectric constant air medium, which is contained in the gap between the first substrate 10 and the second substrate 20, can reduce the impendence of the first substrate 10 and the capacitance coupled to the first substrate 10. Therefore, the loss of the inductor 22a can be reduced and the quality factor of the inductor 22a can be increased.

Figure 1B:
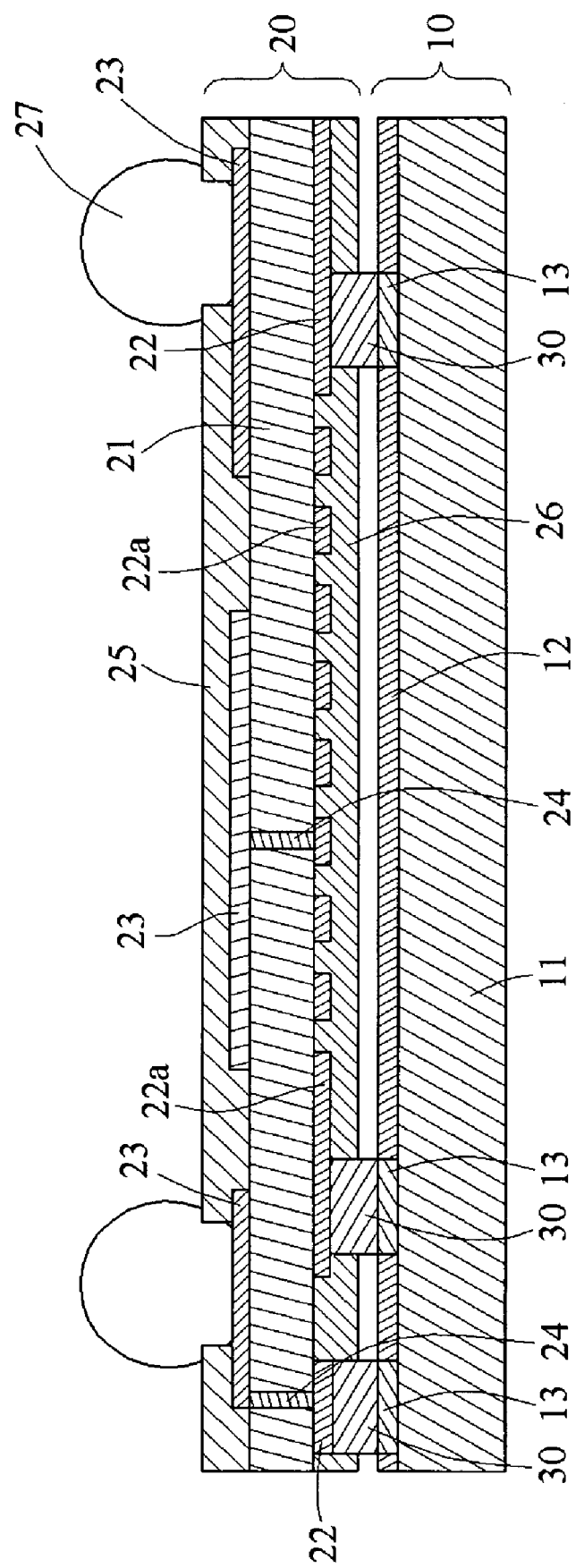

Refer to FIG. 1B illustrating the other structure of the first embodiment. The structure is similar to that of FIG. 1A. The surfaces on which the first metal layer 22 and the second metal layer 23 are provided are different from those in FIG. 1A. The first metal layer 22 is formed on the first surface of the dielectric layer 21. The second metal layer 23 is formed on the second surface of the dielectric layer 21. A first embodiment of a manufacturing method of a wafer level packaging structure with inductors will be described with respect to FIG. 2A and FIG. 2B. First, a first substrate 10 is provided. The first substrate 10 includes a silicon substrate 11, insulating areas 12 and conductive areas 13. The insulating area 12 can be formed by oxidizing the silicon substrate 11 or can be a passivation layer formed by other insulation materials. The conductive area 13 can be the metal layout on the silicon substrate 11, which is formed by depositing, photographing and etching a metal material. The first substrate 10 can include an active component and/or passive component (not shown), where the conductive area 13 electrically connects the active components and/or the passive components (not shown). The thickness of the first substrate 10 can be decreased by a wafer thinning process.

The process of forming the second substrate will be detailed described with respect to FIG. 2B and FIG. 2D. First, a dielectric layer 21 is provided. A first metal layer 22 is formed on a first surface of the dielectric layer 21 and a second metal layer 23 is formed on a second surface of the dielectric layer 21. The dielectric layer 21 can be made of polyimide or polyester. One having ordinary skills in the art would appreciate that the dielectric layer 21 doesn't need to be made of polyimide or polyester but instead may be made of a different material as long as that material has a soft and/or flexible property. In FIG. 2C, the first metal layer 22 and the second metal layer 23 are etched to form the coils of the inductors 22a and metal wires. And a mechanical drilling method, a laser drilling method or an etching method is used to form via holes (the same location with the metal conductors 24) in the dielectric layer 21. Then, metal material is deposited in the via holes to form metal conductors 24 therein, which connect the first metal layer 22 and the second metal layer 23. Therefore, the second substrate will have an inductor 22a, a re-wired metal wire, and a metal conductor, 24, which connects the inductor 22a and the second metal layer 23. Increasing the thickness of the dielectric layer 21 can increase the inductance of the three-dimensional solenoid inductor 22a. With respect to FIG. 2D, a first insulation layer 25 and a second insulation layer 26 are formed where the first insulation layer 25 covers the first metal layer 22 and the second insulation layer 26 covers the second metal layer 23. The first insulation layer 25 and the second insulation layer 26 can be formed by evaporating a silicon oxide layer on the first metal layer 22 and the second metal layer 23, or by coating an organic film on the first metal layer 22 and the second metal layer 23. The first insulation layer 25 and the second insulation layer 26 are used as passivation layers for insulation and protection. Next, the first insulation layer 25 and the second insulation layer 26 can be etched to expose the joints of the first metal layer 22 and the second metal layer 23, which are used as metal wires.

With respect to FIG. 2E, the first substrate 10 is connected to the second substrate 20 by pads 30, such, that there will be gaps between the first substrate 10 and the second substrate 20. The pads 30 are used for electrically connecting the inductors 22a to the first substrate 10. The pads 30 can be formed by depositing a metal material or conducting material on the conductive area 13 and/or the exposed joint of the second metal layer 23 first, followed by using a hot press, a eutectic welding, a conductive particle welding or an electron beam welding process for binding, on the exposed joint of the conductive area 13 and the second metal layer 23. When processing the alignment binding, a carrier 40 is first used to attract the second substrate 20, then the carrier 40 is used to put the second substrate 40 at the corresponding position of the first substrate 10 to process hot press. The carrier 40 can be made of hard and transparent material, which can make the first substrate 10 easy to align and bind. After binding, the carrier 40 can be removed. Since there are pads 30 between the first substrate 10 and the second substrate 20, there is space between the first substrate 10 and the second substrate 20 to contain a low dielectric constant air medium, which can reduce the impedance of the first substrate 10 and the capacitance caused by the inductor 22a, coupled to the first substrate 10. Therefore, the quality factor of the inductor 22a can be improved.

With respect to FIG. 2F, solder bumps 27 can be formed on the first metal layer 22 for processing the flip chip binding. Since the dielectric layer 21 is flexible, which can provide the joint of the solder bump with a better stress buffer ability, the reliability of the joint of the module, the flip chip or the wafer level binding assembly can also be improved.

Figure 2G:
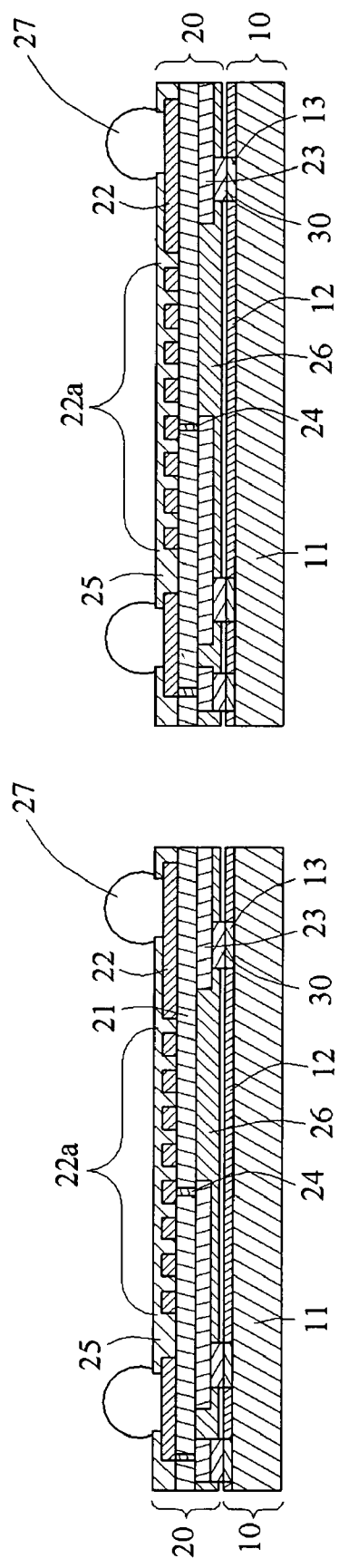

With respect to FIG. 2G, the first substrate 10 and the second substrate 20 are cut to form the wafer level package structures with inductors (as shown in FIG. 1). If the first substrate 10 undergoes a wafer thinning process before the binding process with the second substrate 20, the inductor 22a can be prevented from damage in the wafer thinning process. The size of the wafer level package structures with inductors can be reduced by the wafer thinning process and the inductor quality factor is improved by the air medium between the inductor 22a and the first substrate 10. The dielectric layer 21 can reduce the area surface of the inductor coil 22a and the magnetic field effect. Therefore, the electric properties of the passive component can be improved. Besides, using a binding process to produce the air gap can avoid using the complicated etching process, which may increase the yield.

The process for forming the other structure of the first embodiment is similar to those in FIG. 2A to FIG. 2G.

Figure 2H:
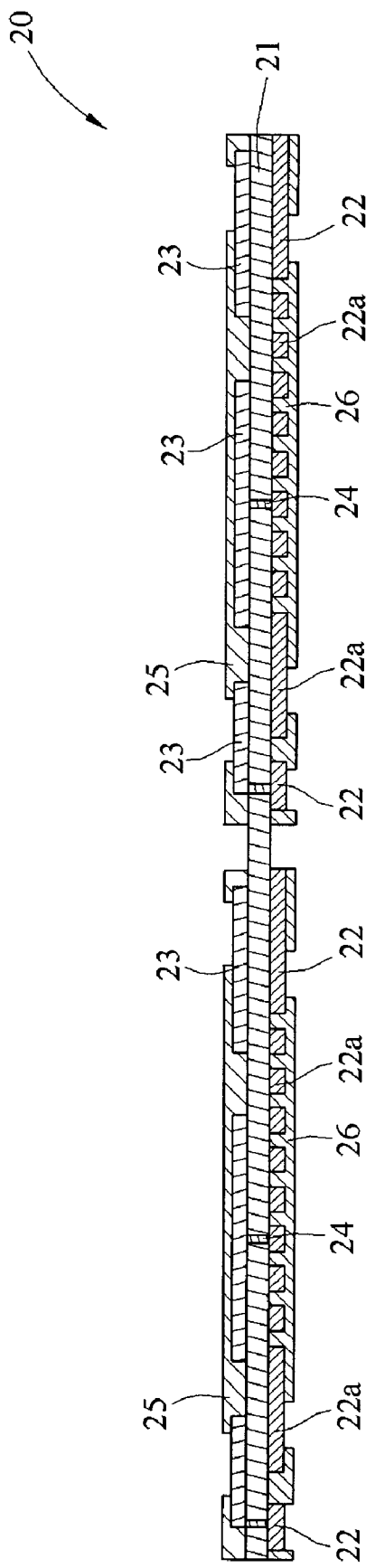
Figure 2I:
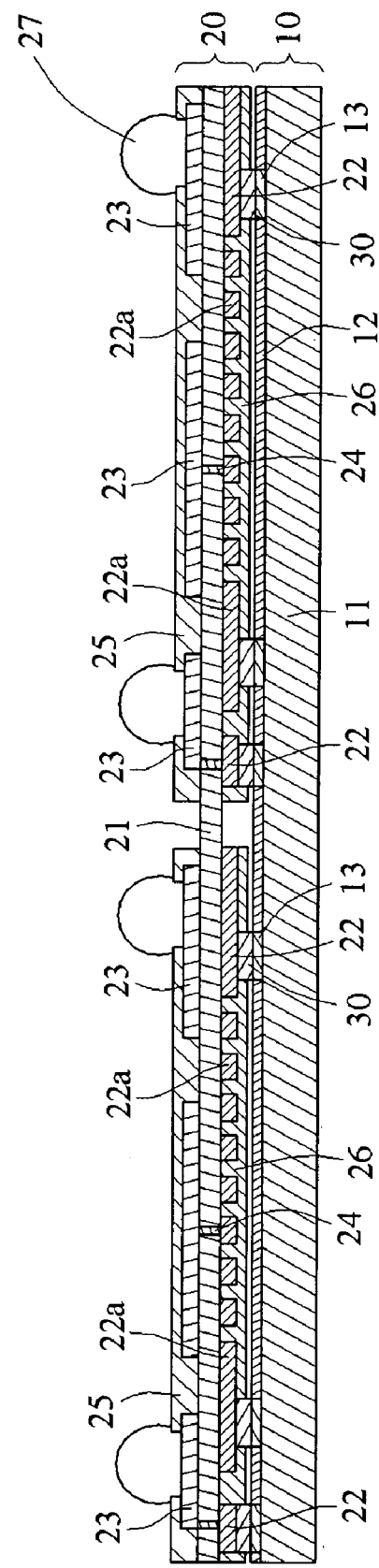

In FIG. 2H, a first metal layer 22 is formed on a second surface of the dielectric layer 21 and a second metal layer 23 is formed on a first surface of the dielectric layer 21. By similar process, the wafer level package structures with inductors as illustrated in FIG. 2I is formed.

Figure 3A:
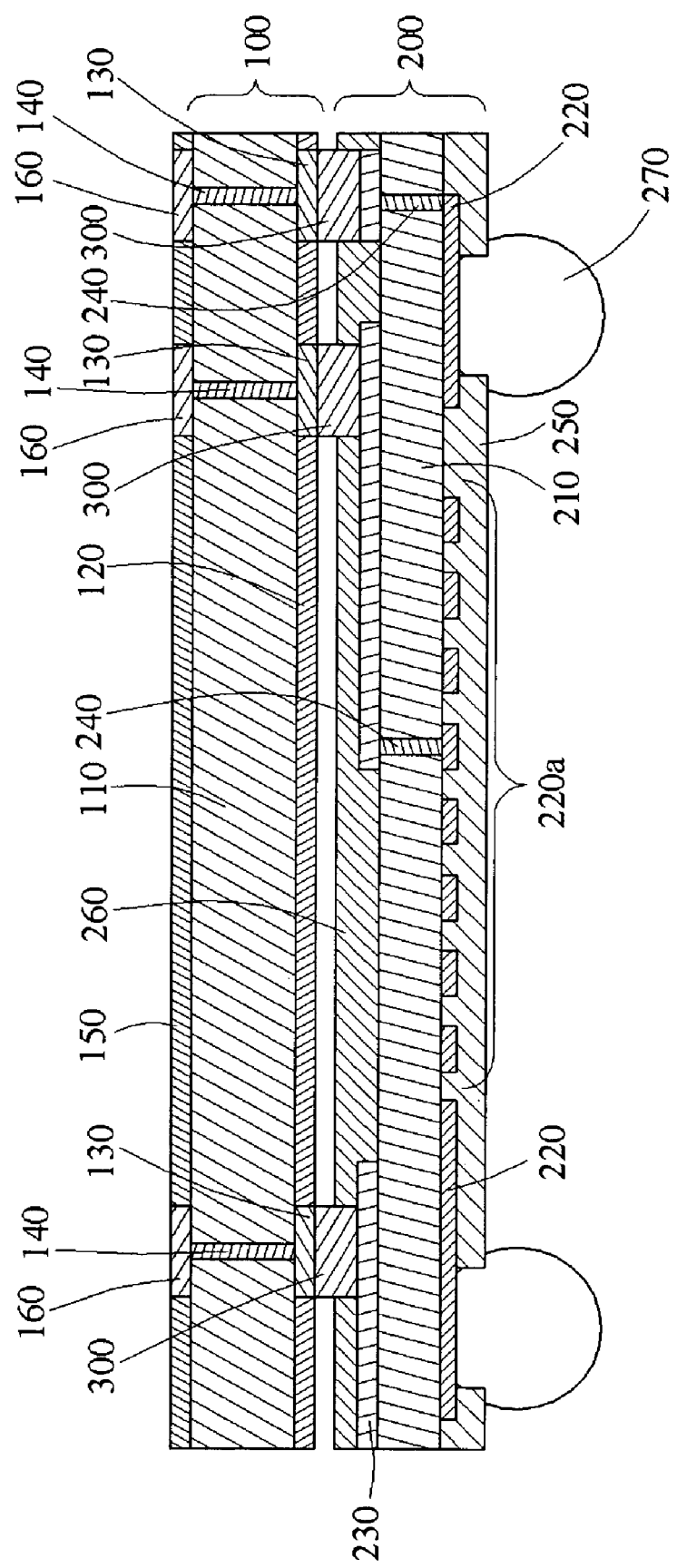

FIG. 3 is a second embodiment of a wafer level packaging structure with inductors. The structure includes a first substrate 100, pads 300 on the first substrate 100, and a second substrate 200 on the pads 300. The second substrate 200 has an inductor 220a; the pads 300 are used for electrically connecting the inductor 220a to the first substrate 100. There are gaps between the first substrate 100 and the second substrate 200. The first substrate 100 can further comprise active components and/or passive components (not shown).

The second substrate 200 includes a dielectric layer 210; a first metal layer 220 on the first surface of the dielectric layer 210 (as shown in FIG. 1), which includes the inductor 220a; a second metal layer 230 on the second surface of the dielectric layer 210 (as shown in FIG. 1); second metal conductors 240 which are located in the via holes of the dielectric layer 210 for connecting the first metal layer 220 and the second metal layer 230; a first insulation layer 250 which is located on the first metal layer 220, and a second insulation layer 260 which is located on the second metal layer 230. The second substrate 200 can further include solder bumps 270, which are located on the first metal layer 220.

The first substrate 100 includes a silicon substrate 110, first insulating areas 120, first conductive areas 130, second insulating areas 150, second conductive areas 160 and first metal conductors 140. The first insulating area 120 and the first conductive area 130 are located on the first surface of the silicon substrate 110 and the second insulating area 150 and the second conductive area 160 are located on the second surface of the silicon substrate 110. The first metal conductor 140 can be formed by the same process for the metal conductor 24 in the first embodiment, and the first metal conductor 140 can electrically connect the first conductive area 130 and the second conductive area 160. Besides, the second surface of the silicon substrate, which includes an electric pattern, active components and/or passive components can be an active side of the silicon substrate 110, where the second conductive area 160 electrically connects the active components and/or passive components (not shown). Since there are pads 30 interposing between the first conductive area 130 and the second metal layer 230, the first metal layer 220 (including the inductor 220a), the second metal conductor 240, the second metal layer 230, the pad 300, the first conductive area 130, the first metal conductor 140 and the second conductive area 160 can become a whole conducting path.

The manufacturing method of the second embodiment and the process of cutting the wafer level packaging structure can refer to the description in the first embodiment. In the second embodiment, the second substrate 200 with the inductor 220a can be bond to the first conductive area 130 on the first surface of the silicon substrate 110, and the inductor 220a can be electrically connected to the second conductive area 160 on the second surface (the active surface) of the silicon substrate 110, by the first metal conductor 140. Therefore, a wafer level packaging structure, in which both sides of the silicon substrate 110 include conductive pads, can be formed.

Figure 3B:
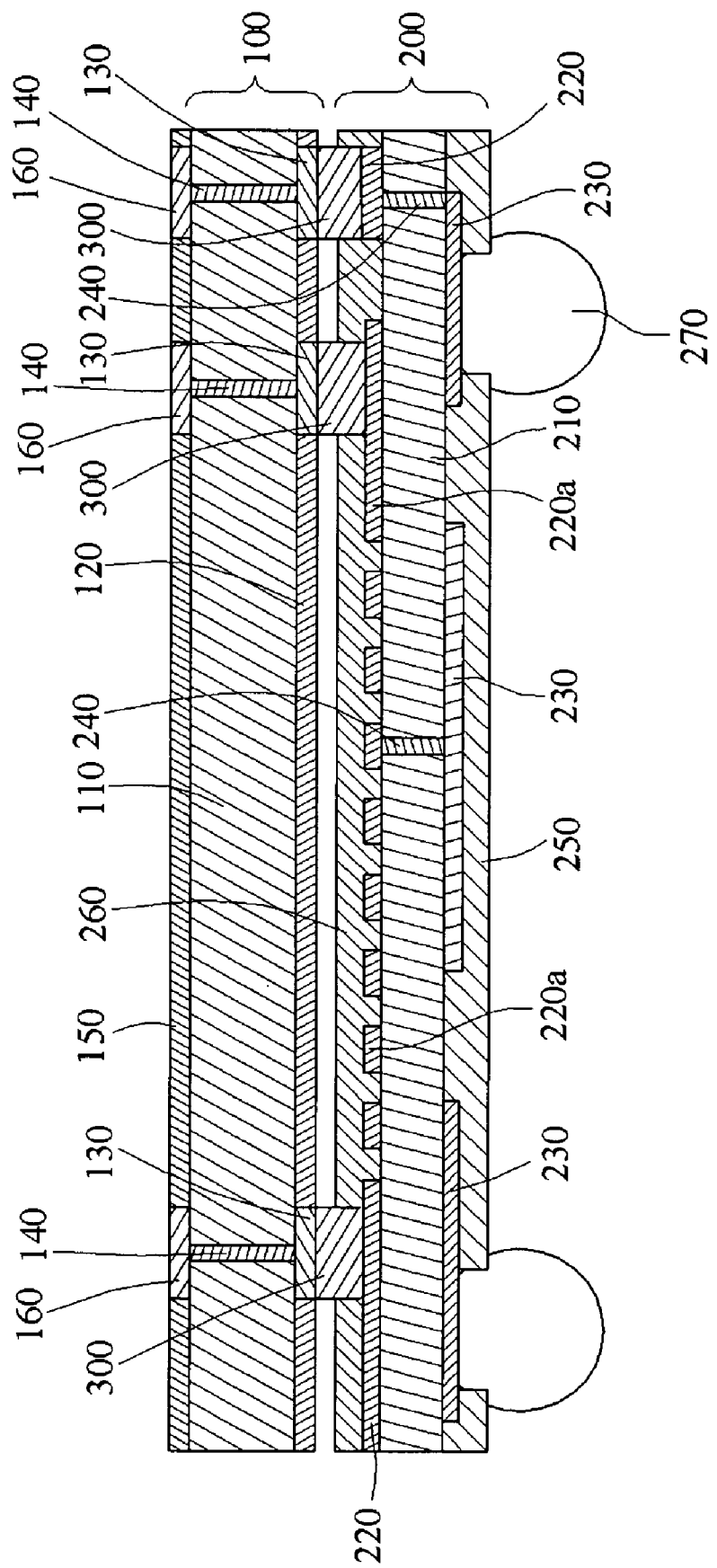

Refer to FIG. 3B illustrating the other structure of the second embodiment. The structure is similar to that of FIG. 3A. The first metal layer 220 is formed on the first surface of the dielectric layer 210. The second metal layer 230 is formed on the second surface of the dielectric layer 210.

Because the size limitation of the passive components (for example: an inductor, a capacitor or a resistor), high frequency, radio frequency or mixing signal circuit modules can not be like the digital module, which can shrink with the features. Taking the signal transmission and the connection between the circuits in mind, not only the resistor and capacitor effects need to be considered, but also the inductor effect. Besides, when the integrity is getting higher, the noise coupled in the integrated circuit will affect the circuit more. Concerning a high frequency signal, if the impendence of the capacitance becomes lower, the signal will be much easier to transmit from the substrate to other circuits. Presently, since a high frequency circuit or a radio frequency circuit includes a lot of passive components such as inductors, the density of the metal layer can hardly satisfy the requirement of the semiconductor factory. Since the method of the invention uses a binding process to form a inductor on the semiconductor substrate instead of directly manufacturing an inductor on the semiconductor substrate, the density of the metal layer will not get higher, the noise coupled with the substrate will decrease, the size of the passive component can be reduced, and the electric property of the passive components and the yield can be improved.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

What is claimed is:

1. A manufacturing method of a wafer level package structure with inductors comprising:
   providing a first substrate;
   forming a second substrate, the second substrate comprising a plurality of inductors;
   bonding the first substrate and the second substrate through a plurality of pads to form a gap between the first substrate and the second substrate, wherein the gap is between the first substrate and the plurality of inductors, and wherein the plurality of pads electrically connect the plurality of inductors to the first substrate; and
   cutting the first substrate and the second substrate to form a plurality of wafer level package structures, wherein the step of forming the second substrate comprises:
   providing a dielectric layer having a first and a second surface, wherein a first metal layer is formed on the first surface of the dielectric layer, and a second metal layer is formed on the second surface of the dielectric layer, wherein the dielectric layer is flexible material, and wherein the flexible material comprises polyimide or polyester;
   etching the first metal layer and the second metal layer to form the plurality of inductors and a plurality of metal wires;
   forming a plurality of via holes in the dielectric layer;
   forming a plurality of metal conductors in the via holes, wherein the metal conductors connects the first metal layer and the second metal layer;
   forming a plurality of solder bumps on the first metal layer;
   forming a first insulation layer and a second insulation layer wherein the first insulation layer covers the first metal layer and the second insulation layer covers the second metal layer; and
   etching the first insulation layer and the second insulation layer to expose a plurality of joints of the metal wires.

2. The manufacturing method of claim 1, further comprising:
   forming a plurality of electric components on the first substrate, wherein the plurality of inductors electrically connect to the plurality of electric components through the plurality of pads.

3. The manufacturing method of claim 1, wherein the first substrate comprises a first surface and a second surface, the first surface connecting to the plurality of pads and the manufacturing method further comprising:
   forming a plurality of electric components on the second surface; and
   forming a plurality of metal conductors, which penetrate through the first substrate, wherein the metal conductors electrically connect the plurality of pads on the first surface to the plurality of electric components on the second surface.

4. A wafer level package structure with inductors comprising:
   a first substrate;
   a plurality of pads on the first substrate;
   a second substrate on the plurality of pads, the second substrate comprising a plurality of inductors, the plurality of inductors electrically connected to the first substrate via the plurality of pads; and
   a gap formed between the first substrate and the second substrate and between the first substrate and the plurality of inductors wherein the second substrate comprises:
   a dielectric layer;
   a first metal layer on a one surface of the dielectric layer;
   a second metal layer on the other surface of the dielectric layer;
   a plurality of inductors and wires are patterned at least one of the first and the second layers;
   a plurality of metal conductors in the via holes of the dielectric layer, wherein the metal conductors are used to connect the first metal layer and the second metal layer;
   a first insulation layer on the first metal layer; and
   a second insulation layer on the second metal layer.

5. The wafer level package structure with inductors of claim 4 further comprising a plurality of solder bumps on the first metal layer.

6. The wafer level package structure with inductors of claim 4, wherein the dielectric layer is made of a flexible material.

7. The wafer level package structure with inductors of claim 6, wherein the flexible material comprises polyimide or polyester.

8. A wafer level package structure with inductors comprising:
 a first substrate;
 a plurality of pads on the first substrate;
 a second substrate on the plurality of pads, the second substrate comprising a plurality of inductors, the plurality of inductors electrically connected to the first substrate via the plurality of pads; and
 a gap formed between the first substrate and the second substrate and between the first substrate and the plurality of inductors, wherein the first substrate further comprising a plurality of electric components, wherein the plurality of inductors electrically connect to the plurality of electric components through the plurality of pads.

9. A wafer level package structure with inductors comprising:
 a first substrate;
 a plurality of pads on the first substrate;
 a second substrate on the plurality of pads, the second substrate comprising a plurality of inductors, the plurality of inductors electrically connected to the first substrate via the plurality of pads; and
 a gap formed between the first substrate and the second substrate and between the first substrate and the plurality of inductors, wherein the first substrate comprises:
 a first surface connecting to the plurality of pads;
 a second surface having a plurality of electric components thereon; and
 a plurality of metal conductors, which penetrate through the first substrate, wherein the plurality of metal conductors electrically connects the plurality of pads on the first surface and the plurality of electric components on the second surface.

10. A wafer level package structure with inductors comprising:
 a first substrate;
 at least one pad on the first substrate; and
 a second substrate on the at least one pad, the second substrate having at least one inductor, the at least one inductor electrically connected to the first substrate via the at least one pad, wherein there is a space between the first substrate and the second substrate and between the first substrate and the at least one inductor, and the wafer level package structure is divided from a wafer level package structure; and
 wherein the second substrate comprises:
 a dielectric layer wherein the dielectric layer is made of a flexible material, and wherein the flexible material comprises polyimide or polyester;
 a first metal layer on one surface of the dielectric layer;
 a second metal layer on the other surface of the dielectric layer;
 a plurality of inductors and wires are patterned at least one of the first and the second layers;
 a plurality of metal conductors in the via holes of the dielectric layer, wherein the metal conductors are used to connect the first metal layer and the second metal layer;
 a first insulation layer on the first metal layer;
 a second insulation layer on the second metal layer; and
 a plurality of solder bumps on the first metal layer.

11. The wafer level package structure with inductors of claim 10, wherein the first substrate further comprising a plurality of electric components, wherein the at least one inductor electrically connects to the plurality of electric components through the at least one pad.

12. The wafer level package structure with inductors of claim 10, wherein the first substrate comprises:
 a first surface connecting to the at least one pad;
 a second surface having at least one electric component thereon; and
 at least one metal conductor, which penetrates through the first substrate, wherein the metal conductor electrically connects the at least one pad on the first surface and the at least one electric component on the second surface.

13. A wireless transmission module, comprising at least one inductor, which is manufactured by the manufacturing method of claim 1.

14. A wireless transmission module, comprising at least one inductor of claim 10.

* * * * *